United States Patent [19]

Chapman

[11] Patent Number: 5,758,817
[45] Date of Patent: Jun. 2, 1998

[54] APPARATUS AND PROCESS FOR REMOVING SURFACE MOUNTED COMPONENTS FROM PRINTED WIRING ASSEMBLIES

[75] Inventor: Ray Chapman, Argyle, Tex.

[73] Assignee: Resource Concepts, Inc., Dallas, Tex.

[21] Appl. No.: 618,649

[22] Filed: Mar. 19, 1996

[51] Int. Cl.$^6$ .................................................. B23K 1/018
[52] U.S. Cl. ................................................ 228/264; 228/19
[58] Field of Search ........................... 228/264, 119, 228/102, 19

[56] References Cited

U.S. PATENT DOCUMENTS

| | | | |
|---|---|---|---|
| 4,561,584 | 12/1985 | Hug | 228/264 |
| 4,775,776 | 10/1988 | Rahn et al. | 228/102 X |
| 5,148,969 | 9/1992 | Boucher et al. | 228/264 |

OTHER PUBLICATIONS

*IBM Tech, Disclosure Bulletin* vol. 28, No. 1 Jun. 1985 pp. 178–179.

*Primary Examiner*—Kenneth J. Ramsey
*Attorney, Agent, or Firm*—R. Darryl Burke; Worsham, Forsythe & Wooldridge

[57] ABSTRACT

An apparatus comprises (a) at least one heater to heat a printed wiring assembly until solder holding selected electrical components reaches a flow temperature; (b) a presence detector to determine when the printed wiring assembly is properly positioned at a first location after the printed wiring assembly (particularly, the solder holding the electrical components) has been heated by the heater(s); and (c) a vibrator positioned to vibrate a selected portion of the printed wiring board of the printed wiring assembly with a first vibrating intensity for a first time period. The first vibrating intensity and the first time period must be of sufficient strength and duration to detach the selected electrical component(s) from the printed wiring assembly. The presence detector is electrically coupled to the mechanical vibrator to activate the mechanical vibrator when the printed wiring assembly is positioned at the first location. A transport mechanism automatically transports the printed wiring assembly past the heater(s) to the first location. A first transporting conveyor extends from the first location to a second location, which catches and transports the selected electrical component(s) away from the first location. A second transporting conveyor extending from first location to catch and transport the printed wiring board and any remaining electrical components attached thereto of the printed wiring assembly away from the first location. Processes comprise the following steps: (a) heating the printed wiring assembly until the solder reaches a flow temperature; (b) automatically transferring and positioning the printed wiring assembly to a first position; and (c) automatically vibrating a selected portion of the printed wiring board of the printed wiring assembly with a first intensity for a first time period.

41 Claims, 8 Drawing Sheets

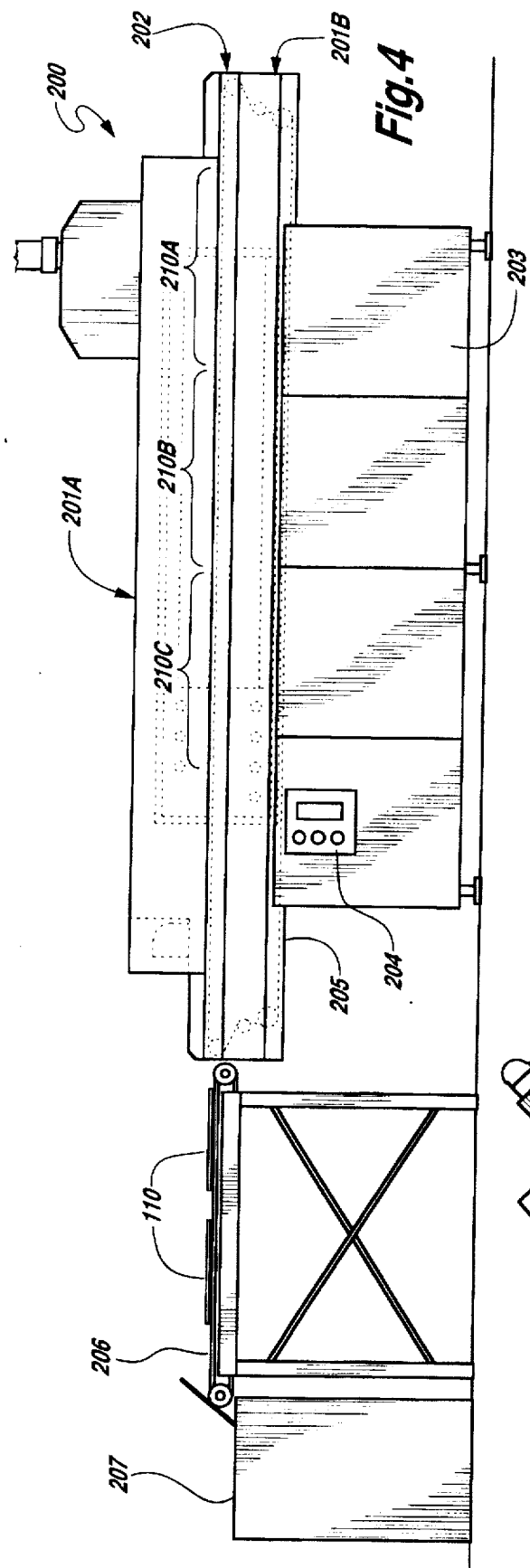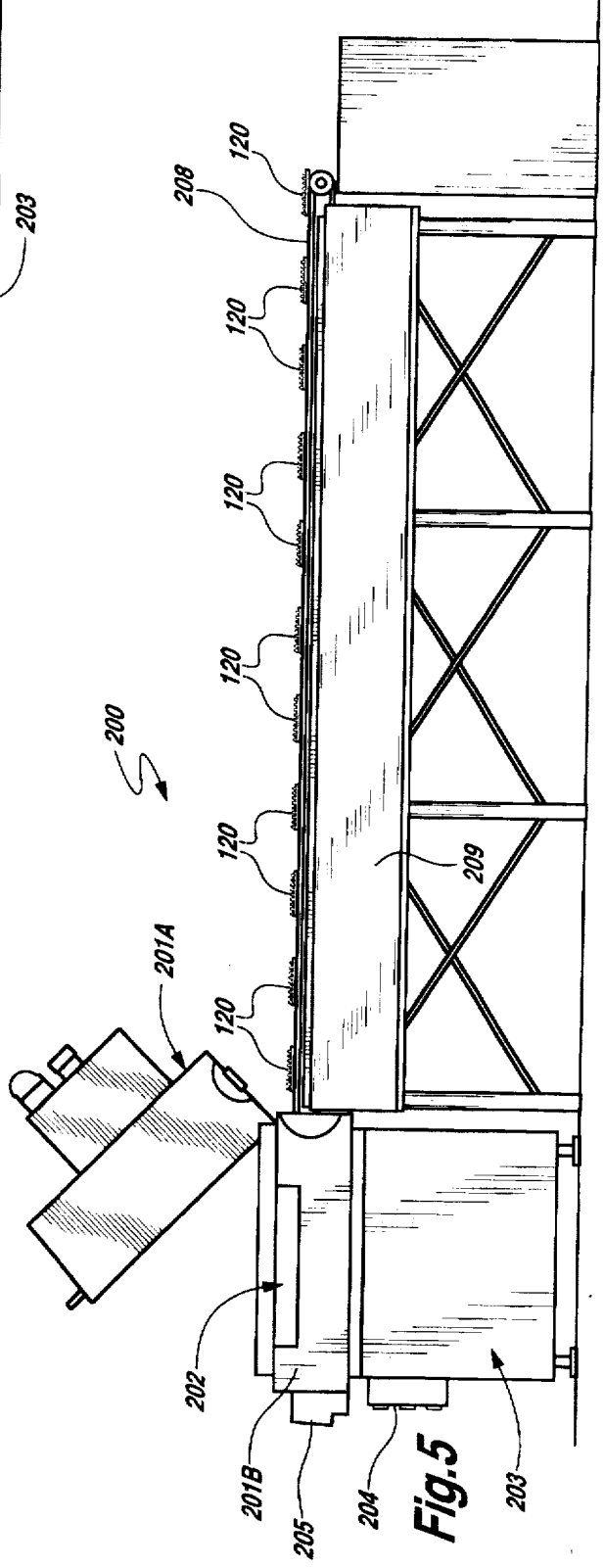

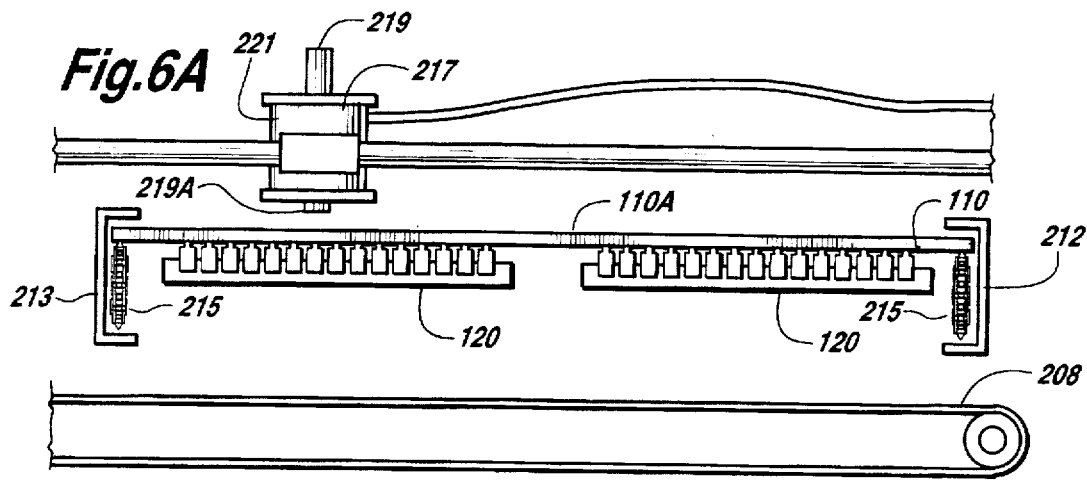
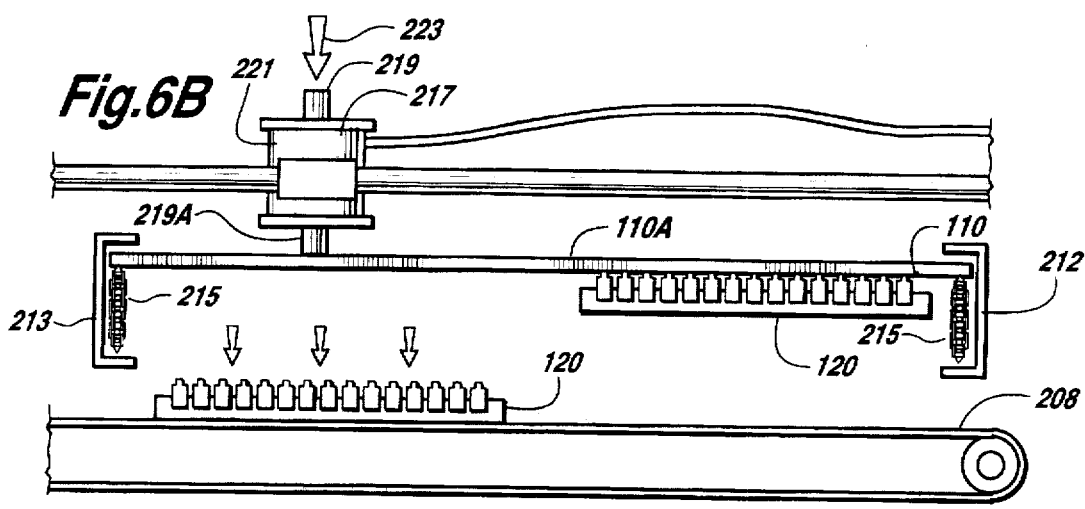
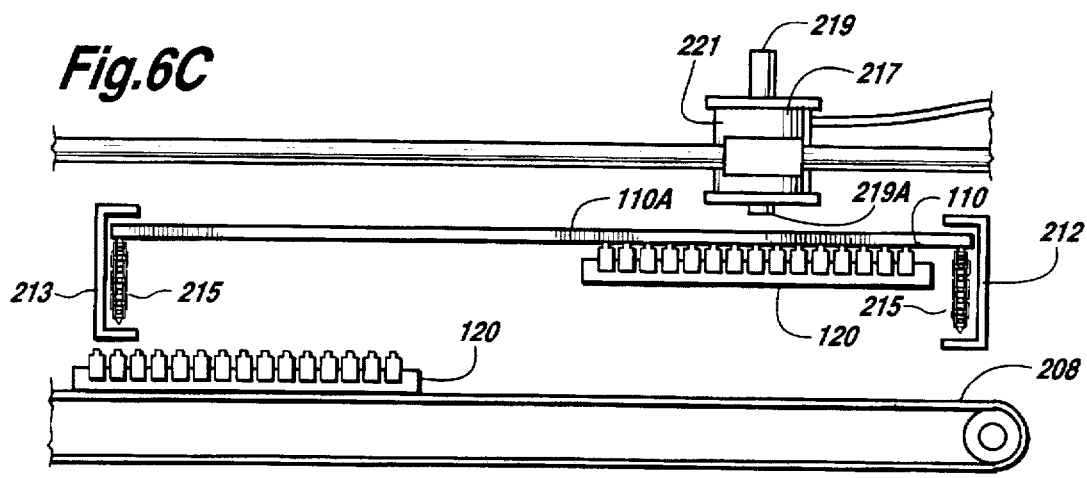

APPARATUS AND PROCESS FOR REMOVING SURFACE MOUNTED COMPONENTS FROM PRINTED WIRING ASSEMBLIES

FIELD OF INVENTION

The present invention relates to an apparatus and process for removing surface mounted components from Printed Wiring Assemblies ("PWA's").

BACKGROUND

As shown in FIG. 1, PWA 100 is assembled by affixing functional electrical components 120, such as integrated circuit chips ("IC's"), connectors and other components, to an un-populated printed Wring board 110 ("PWB"). PWB's 110 are generally manufactured by laminating two (2) or more layers of fiberglass reinforced epoxy or polyimide resins with copper foil. The laminate is then usually coated with a metallic material (e.g., copper or other electrically conductive material) upon which electrical circuits are traced by a variety of imagining and etching techniques.

Over the years, electrical components 120, such as IC's, have been attached and electrically connected to PWB's 110 with a variety of techniques, such as a "through hole" technique and a "surface mount" technique. The "through hole" technique uses holes in PWB's 110 that conform to the configuration of metal leads extending from electrical components 120. Holes are drilled through PWB 110 at the points of contact with the prescreened circuits. Leads of electrical components 120 are then inserted into or through these holes and soldered to the back side of PWB 110. By comparison, metal leads used in the "surface mount" technique connect with conductive pads etched on the surface of PWB 110. Solder paste is then applied to the surface of PWB 110 upon which the circuits are etched and electrical components 120 are positioned precisely on the surface of PWB 110, so the leads make contact with the appropriate circuit pad. PWB 110 and solder paste are then heated to the point at which the solder flows (i.e., melt-flow temperature) to form electrical connections between the leads and the circuit pad. When the solder cools, the solder becomes solid and forms a permanent connection between electrical components 120 and PWB 110. Conventional re-flow ovens generally use a horizontal, continuous belt to hold PWB's 110 along with surface mount electrical components 120 and solder paste. The oven generally heats the assemblies with radiant heat in gradient or zoned fashion, which collectively heat PWB 110, electrical components 120, and solder paste to a successively higher temperature until the flow temperature of the solder is reached.

For a variety of reasons, it is often necessary to remove surface mounted electrical components 120 from PWA's 100, such as if the electrical components 120 are defective, they may require replacement. Moreover, if salvageable from the otherwise obsolete PWA's 100, certain electrical components 120 (e.g., microprocessors, memories, etc.) are valuable and reusable and may be removed and reused. A number of existing techniques can be used to remove these electrical components 120 from PWB 110, all of which have significant disadvantages.

Some techniques use a surface mount device rework station in which PWA 100 is mounted by hand in front of or over an electrically heated nozzle that is aimed at the leads of the particular electrical component 120 to be removed. The electrically heated nozzle transmits heat to the solder holding electrical component 120 to PWB 110, which eventually brings the solder to flow temperature. This enables the heated component to be manually detached. This procedure is inefficient in terms of labor and impractical over a wide range of PWA's 100, as it requires different types of heated nozzles for different types of surface mounted electrical components 120.

Alternatively, a heat gun may be used to heat electrical components 120 on PWB's 110 to a temperature slightly above the flow temperature of the solder holding electrical components 120 to the PWB 110, which enables selected electrical component 120 to be manually detached. This procedure is also labor intensive when used to remove several electrical components 120 from PWB 110. In addition, this procedure introduces additional problems, such as thermal shocking, because it is unable to effectively control the heating temperature. Thermal shocking has the potential of damaging the very electrical components 120 that the procedure is attempting to remove and reuse.

Additionally, heat lamps are sometimes used to elevate the temperature of the solder to flow temperature, so that electrical components 120 can be manually removed. The use of heat lamps, however, introduces additional problems associated with the over exposure to photo-radiation, such as a number of health hazards (e.g., skin cancer).

Another alternative approach uses a high temperature bath, such as a molten solder bath, upon which PWA 100 is floated. The high temperature bath heats PWA 100, so that the solder holding electrical components 120 to PWB 110 rises above its flow temperature. The heated PWB 110 then may be manually struck in a way that dislodges all electrical components 120 onto a surface from which electrical components 120 can then be sorted and collected. Alternatively, individual electrical components 120 can be manually removed after PWB 110 reaches solder flow temperature. Once again, this approach is labor intensive and the inability of these techniques to control the temperature of PWA 110 introduces additional health risks (e.g., increased health risks associated with the inhalation of potentially toxic fumes from the solder).

SUMMARY

In particular, this invention relates to an automated process whereby such PWA's are heated successively just above the melt flow temperature of the binding solder that holds the electrical components to the PWB, which are preferably surface mounted, and a vibrating device which strikes the back side of the PWB in a way that dislodges the electrical components from those areas on the opposite side of the PWB affected by the vibration. The description and related drawings describe preferred embodiments of the apparatus and processes.

Preferred embodiments of the apparatus are generally comprised of (a) at least one heater to heat the PWA until the solder holding the electrical components reaches a flow temperature; (b) a presence detector to determine when the PWA is properly positioned at a first location after the PWA (particularly, the solder holding the electrical components) has been heated by the heater(s); and (c) a vibrator positioned to vibrate a selected portion of the PWB of the PWA with a first intensity for a first time period. The first intensity and the first time period need to be of sufficient strength and duration to detach the selected electrical component(s) from the PWA. The presence detector is electrically coupled to the vibrator to activate the vibrator when the PWA is positioned at the first location.

A transport mechanism may be used to automatically transport the PWA past the heater(s) to the first location. The transport mechanism is preferably comprised of a plurality of rails and at least one transport chain and/or sprocket belt. A first rail and a second rail of the plurality of rails are positioned on opposite sides of the PWA to control and direct the flow or path the PWA's are transported along. A first distance separates the first rail from the second rail, which is adjustable by moving the second rail. Additional rails can be used to transport and process additional PWA's simultaneously. Preferred embodiments are adapted to accommodate PWA's having a width between ¼" to 18½" inches. The transport chain(s) is selectively attached to the PWA to transport the PWA along the transport path. The transport mechanism transports the PWA at a first speed, which is between 0.05–12.00 feet per minute.

Likewise, preferred embodiments are also comprised of a first transporting conveyor and a second transporting conveyor. The first transporting conveyor extends from the first location to a second location (away from the first location), which catches and transports the selected electrical component(s) away from the first location. The second transporting conveyor extends from the first location to catch and transport the PWB and any remaining electrical components attached thereto of the PWA away from the first location. The transport mechanism transports the PWA at a first speed and is also comprised of control circuitry that is electrically coupled to a motor that powers and moves transport chain(s) along with the PWA's.

The heater(s) are preferably positioned in an enclosed chamber (e.g., oven), which has a number of entrances and exits (e.g., openings) if the transport mechanism, first conveyor, and second conveyor are utilized. The transport mechanism transports the PWA into and through the oven past the heater(s), so that the solder holding the selected electrical component(s) can be heated to a flow temperature. The heater(s) are organized and/or divided into a plurality of heated zones, each of which is independently controlled, so that the PWA is gradually heated. The enclosed chamber preferably has a hinged lid. The heater(s) heat the solder to a temperature in a range of 0–999° F. A screen is positioned beneath the PWA's in order to catch any of the electrical component(s) that prematurely fall from the PWB of the PWA. The screen is also positioned under the vibrating mechanism, presence detector, rails, and transport screen, so as to not interfere with the operations of the preferred embodiment. The screen is preferably comprised of a thermally conductive material, such as metal. The screen may also form a conveyor belt that transports any electrical component(s) that prematurely fall from the PWB of the PWA.

The PWA has a first surface and a second surface, wherein the selected electrical component(s) are positioned on the first surface, which is preferably positioned or oriented downward, so that the selected electrical component(s) fall downward due to gravity after the PWA has been vibrated by the mechanical vibrator.

Preferred embodiments of the presence detector are comprised of a light source and a photo sensor. The light source emits light that extends across the transport path. The photo sensor activates the mechanical vibrator when the light source is shielded by the PWA. Electrical delay circuitry that is electrically coupled to the presence detector and to the mechanical vibrator may also be used to cause the presence detector to delay activating the mechanical vibrator.

The mechanical vibrator starts vibrating the PWA at a first time for a first time period. The mechanical vibrator is further comprised of control circuitry, the control circuitry independently controls the first time, the first time period, and the first intensity. The mechanical vibrator also preferably comprises an oscillating plunger that when the mechanical vibrator is activated by the presence detector, the oscillating plunger contacts the PWA with a first force to generate the first intensity, thereby vibrating the PWA.

Preferred processes are generally comprised of the following steps: (a) heating the PWA until the solder reaches a flow temperature; (b) automatically transferring and positioning the PWA to a first position; and (c) automatically vibrating a selected portion of the PWB of the PWA with a first intensity for a first time period. Once again, the first intensity and the first time period must be of sufficient strength and duration to detach the at least one selected electrical component. Additional steps of automatically detecting when the PWA is positioned at a second position and automatically initiating the vibrator (or, perhaps, a second vibrator) to perform step (c) can be added after steps (a) and (b). Similarly, preferred embodiments are also comprised of (d) transporting the at least one selected electrical component away from the first position; and (e) transporting the printed circuit board of the electrical wiring assembly away from the first position.

Preferred embodiments of the disclosed invention(s) offer a number of advantages. Appropriate control circuitry for the vibrating plunger device(s) control the intensity of the vibrations and the dwell time of the vibrator (or the actual time the board is vibrated). As a result, preferred embodiments are quite flexible, since the ability to control both vibration intensity and vibration time permits the removal of an almost infinite number of combinations of electrical components, including electrical components with different binding intensities. The degree of control over the removal process also reduces the possibility of damage to the PWA's, PWB's, and electrical components. The conveyor belts and tracks are also wide enough to accommodate PWA's of various sizes, which enhances the flexibility of the preferred embodiment. In addition, the use of one or more mobile vibrating plunger devices (which can be selectively activated) above the traveling circuit boards enhances the flexibility of the preferred embodiment, as it allows selected areas of the PWB or, alternatively, the entire PWB to be vibrated. Consequently, preferred embodiments can remove a vast selection of electrical components. Moreover, preferred embodiments rapidly and efficiently de-populate either single or double-sided PWA's. Preferred embodiments also produce clean and separated electrical components that are easily sorted and packaged with minimal operator attention or component rework. As an example, depending on the PWA's being processed, several hundred components per hour may be removed in this way. Preferred embodiments also reduce the risk of inhalation of potentially hazardous solder fumes and of unnecessary exposure to harmful radiation, because the heating oven is closed to the surrounding environment.

Other advantages of the invention and/or inventions described herein will be explained in greater detail below.

BRIEF DESCRIPTION OF THE DRAWINGS

The accompanying drawings are incorporated into and form a part of the specification to illustrate several examples of the present inventions. These drawings together with the description serve to explain the principles of the inventions. The drawings are only for the purpose of illustrating preferred and alternative examples of how the inventions can be made and used and are not to be construed as limiting the inventions to only the illustrated and described examples. Further features and advantages will become apparent from the following and more particular description of the various embodiments of the invention, as illustrated in the accompanying drawings, wherein:

FIGS. 4 and 5 are two different side views of a preferred component removal system 200, which is generally comprised of main heating unit(s) 201A and 201B, PWA loader 202, power supply and control equipment 203, de-population circuit control module 204, and front panel 205;

FIGS. 6A, 6B, and 6C are cross-sectional views of a single vibrating plunging device 217 in action;

DETAILED DESCRIPTION OF THE PREFERRED EMBODIMENT

Figure 1:
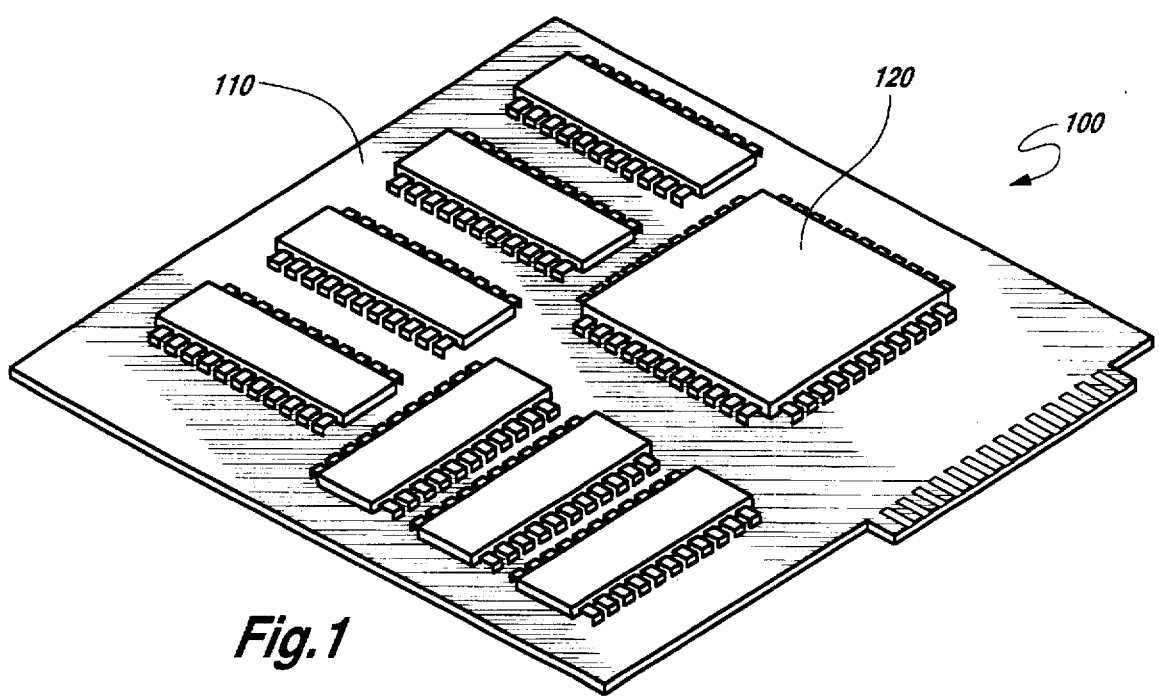
FIG. 1 is a perspective view of PWA 100 having PWB 110 with electrical components 120 (i.e., encapsulated integrated circuits) placed thereon.

The present inventions will be described by referring to the preferred apparatus and method and by showing various examples of how the inventions disclosed herein can be made and used. When possible, like reference characters are used throughout the several views of the drawing to indicate like or corresponding parts.

Figure 2:
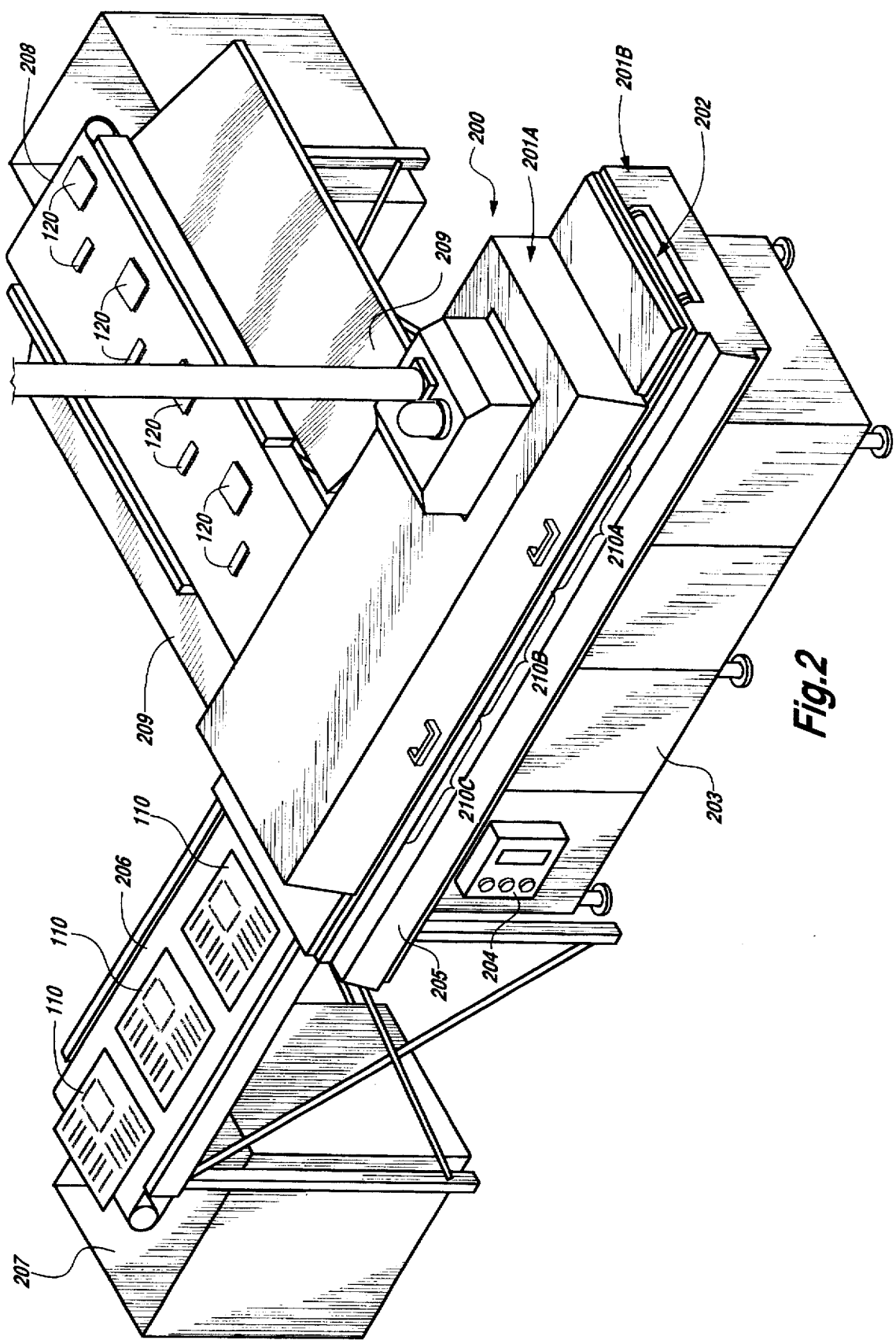
FIG. 2 is a perspective view of the preferred component removal system 200, which is generally comprised of main heating unit(s) 201A and 201B, PWA loader 202, power supply and control equipment 203, de-population circuit control module 204, and front panel 205.
Figure 3:
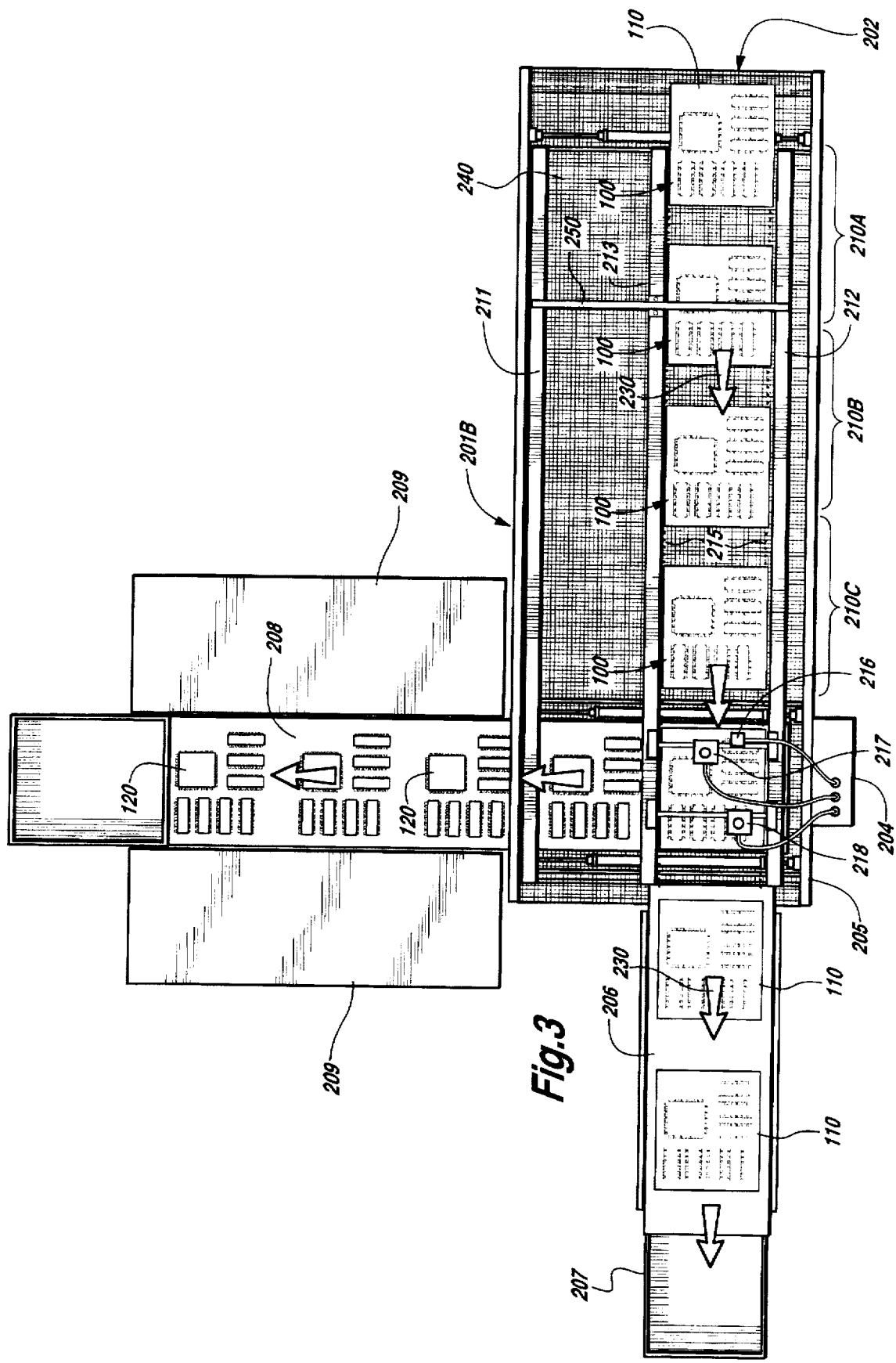
FIG. 3 is a top view of de-population conveyor 206, de-populated board collection container 207, transverse component conveyor 208, and electrical component sorting and packaging station 209 with main heating unit 201A removed to expose the components in main heating unit 201B, such as photo sensor 216 and vibrating plunging devices 217 and 218.

FIG. 2 is a perspective view of a preferred component removal system 200, which is generally comprised of main heating unit(s) 201A and 201B, PWA loader 202, power supply and control equipment 203, de-population circuit control module 204, and front panel 205. FIG. 3 is a top view illustrating the de-population conveyor 206, de-populated board collection container 207, transverse component conveyor 208, and the electrical component sorting and packaging station 209 with main heating unit 201A removed to expose the components in the main heating unit 201B, such as photo sensor 216 and vibrating plunging devices 217 and 218. Transverse component conveyor 208 transports dislodged electrical components 120 to a sorting station where individual electrical components 120 may be sorted and separated. De-population conveyor 206 transports the de-populated or partially de-populated PWB's 110 to collection bin 207, where they may be stored until they are recycled or disposed of otherwise.

FIGS. 3 and 4 also illustrates the preheat section 210A, midpoint heat section 210B, and final heat section 210C. Radiant heating unit(s) are positioned beneath screen 240. Note the use of two (2) fixed rails 211 and 212 and one (1) adjustable rail 213. Fixed rail 212 and adjustable rail 213 hold a sprocket driven conveying chain 215 upon which PWA's 100 are placed for transporting through main heating unit(s) 201A and 201B. Cross member 250 is used to adjust the distance between the adjustable rail 213 and fixed rails 211 and 212 to allow for various sizes of PWA's 100. Preferred embodiments accommodate PWA's 100 with widths between ¼" and 18 ½", although other combinations of rails may be employed to further extend this range of allowable widths.

Figure 8:
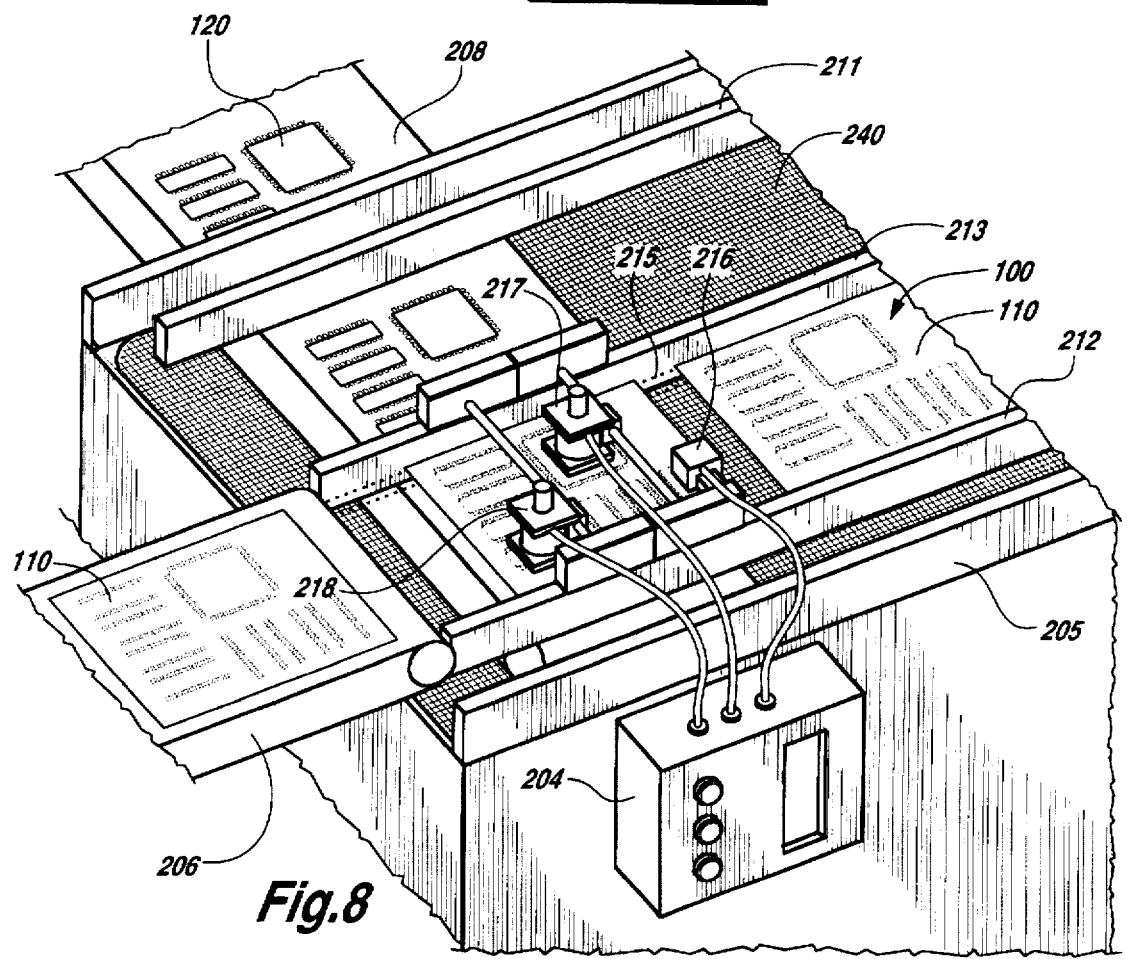
Figure 9A:
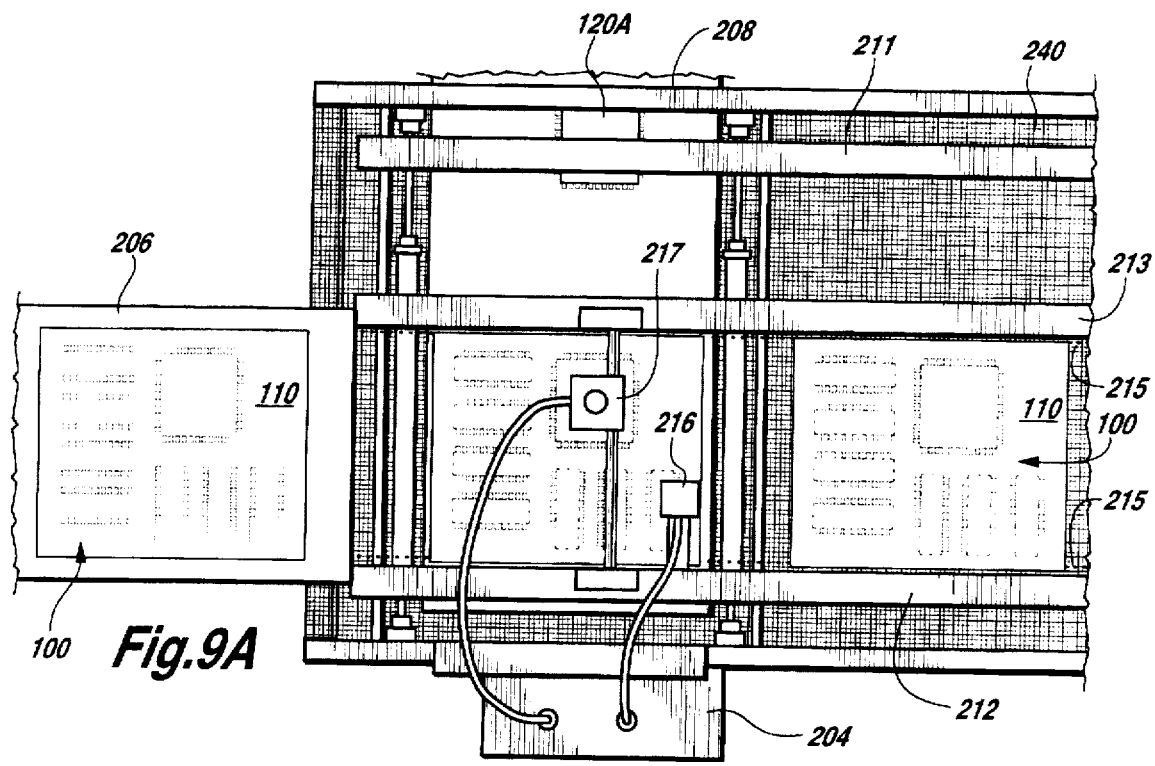
FIGS. 9A and 9B are enhanced top level views showing photo sensor 216 and a single vibrating plunging device 217 in action.
Figure 9B:
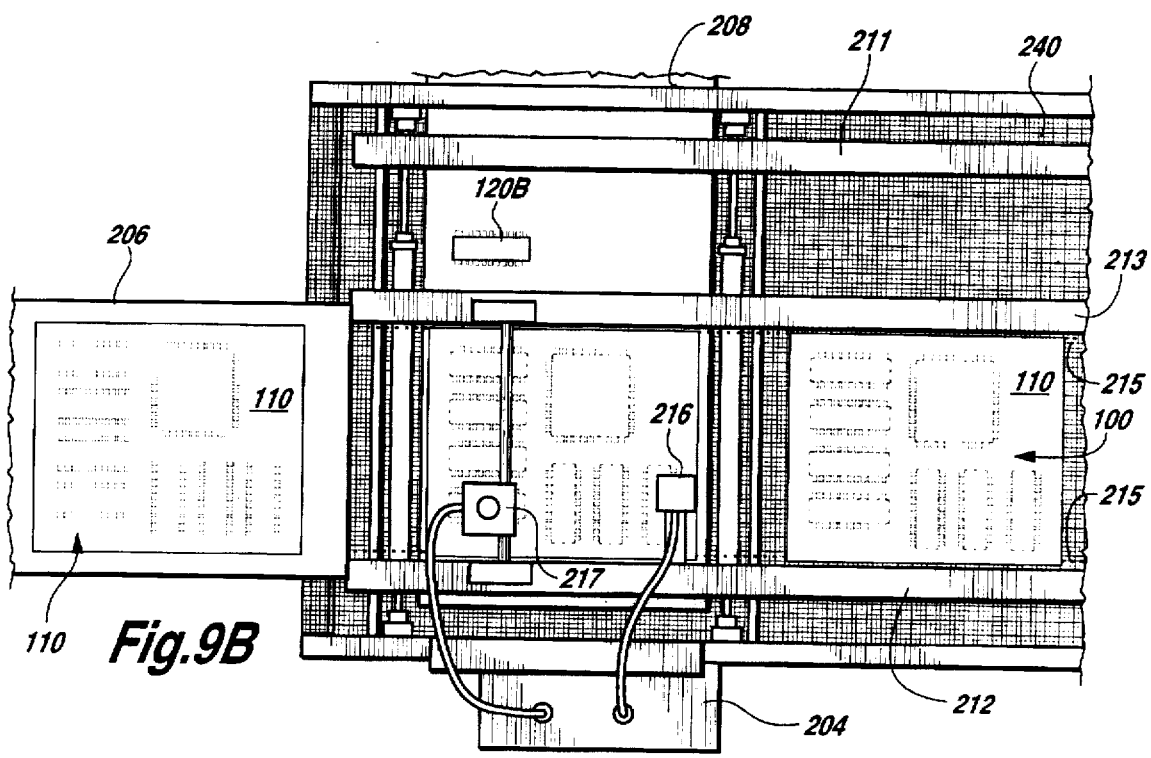

In addition, as shown in FIGS. 3 and 8, some preferred embodiments use a photo sensor 216 and two (2) PWA vibrating plunging devices 217 and 218. Photo sensor 216 detects the approaching PWA 100. These sensors may be placed in a way that provides an option to detect either the leading or the trailing edge of the boards as they are transported. When a PWA 100 passes under photo sensor 216, de-population circuit control module 204 activates a vibrating plunger devices 217 and/or 218. Referring to FIGS. 6A, 6B, and 6C, plunger 219 of vibrating plunger device 217 strikes a selected place on PWB 110 of PWA 100, such as the back, uppermost portion of PWB 110 once the solder holding electrical components 120 reaches its melt-flow temperature. Vibrating plunging devices 217 and 218 then vibrate PWA 100 at the appropriate time in the appropriate position to create a vibration, which causes electrical components 120 to drop or fall off of PWB 110. Vibrating plunging devices 217 and 218 are mobile and adjustable, such that the area on PWB 110 actually vibrated can vary from one PWB 110 to another PWB 110 or within a single PWB 110 itself. In addition, as shown in FIGS. 6B and 6C, vibrating plunging devices 217 and/or 218 can be automatically (or manually) moved to vibrate selected portions or areas of PWB 110 of PWA 100 to cause only certain electrical components 120A and 120B to fall. FIGS. 9A and 9B also show that a single vibrating plunging device 217 can be used in conjunction with photo sensor 216 to vibrate selected portions of PWB 110 of PWA 100 to remove selected electrical components 120A and 120B.

FIGS. 4 and 5 are two different side views of the preferred component, removal system 200, which is generally comprised of main heating unit(s) 201A and 201B, PWA loader 202, power supply and control equipment 203, de-population circuit control module 204, and front panel 205. Note, as shown in FIG. 5, main heating unit 201A is preferably hinged along one side, so that it can be raised vertically from its front edge, permitting access to PWA transport chain(s) 215 located inside main heating unit 201B. Preferred embodiments use modified conventional re-flow ovens to melt the solder of the electrical components. Conventional re-flow ovens are available and well understood in the industry. These models are generally equipped with power supply and control equipment 203.

Preferred processes are comprised of the following steps. Referring to FIG. 5, prior to loading PWA's 100 into the component removal system 200, hinged heating unit 201A is raised to provide access to the processing chamber (see FIG. 3). Adjustable rail 213 is adjusted to accommodate PWA's 100 to be processed and vibrating plunging devices 217 and 218 are positioned to produce vibration on the particular portion or area of PWB 110. Referring to FIG. 3, hinged heating unit 201A is then closed, and conveying chain 215 and the radiant heating unit(s) are activated with power supply and control equipment 203. Conveying chain 215 is electronically controlled by power supply and control equipment 203 to operate between 0.05–12.00 feet/minute. Note the difference between the operation of the preferred embodiment and the operation of a conventional re-flow oven. In a conventional re-flow oven, PWA's 100 are presented component (being bonded) side up, whereas in the preferred embodiment PWA's 100 having electrical components 120 are presented component (being removed) side down. PWA's 100 are then transported into main heating unit(s) 201A and 201B via loading section 202, where they are heated in stages to the solder flow temperature. At this point, the solder that cements the electrical components 120 to PWB 110 begins to soften and flow, but electrical components 120 remain affixed to PWB's by surface tension. In a typical run, PWA's are transported at a speed which is set in the range of 4.0–4.5 feet/minute. Heating unit(s) 220A and 220B, located in sections 210A, 210B, and 210C, as shown in FIG. 3, provide a gradient of heat to the transported PWA's 100 to avoid thermal shock to electrical components 120. Each section has adjustable heating controls and individual thermocouples which provide heat equivalent to 0–999° F. In a typical run, section 210A is heated to a chamber temperature of 260°±5° F., section 210B is heated to a chamber temperature of 351°±5° and section 210C is heated to a chamber temperature of 382°±5° F.

As discussed above, when the temperatures of each section 210A, 210B, and 210C reach their nominal values, PWA's 100 are placed onto conveying chain 215 at the PWA loading section 202. Each PWA 100 is positioned such that its back side is uppermost with electrical components 120 to be removed facing down. PWA 100 then proceeds through heating unit(s) 201A and 201B along the path 230 indicated in FIG. 3, where they are heated successively to just above the flow temperature point of the solder holding electrical components 120 (250° F.–740° F.), depending on the composition of the solder, in section 210C. At this temperature, while the solder holding electrical components 120 to the surface of PWB 110 flows, the surface tension solder generally holds electrical components 120 in place until PWB 110 is tapped or vibrated by vibrating plunging devices 217 and/or 218, as shown in FIGS. 6A, 6B, and 6C. Adjustments may be made to either the chamber temperatures or the transport chain speed via the power supply and control equipment 203 to insure that the temperature of PWA 100 does not exceed the point where the surface tension is overcome and components fall prematurely (without the use of vibrating plunging devices 217 and 218), under force of gravity, from PWB 110. Wire screen conveyor belt 240 is positioned below conveying chain 215 to catch electrical components 120 that prematurely fall from the PWB 110, if any, as the proper temperature is determined. Wire screen conveyor belt 240 collects and transports any such electrical components 120 to the end of the unit, so that heating unit 201A does not need to be opened, thereby releasing significant amounts of heat. In addition, note wire screen conveyor belt 240 also acts to disperse the radiant heat generated by main heating unit(s) 201B to form an even flow. Also, since the wire screen conveyor belt 240 holds heat, it retains heat throughout the process, which helps maintain the heat on PWA's 100.

Figure 7:
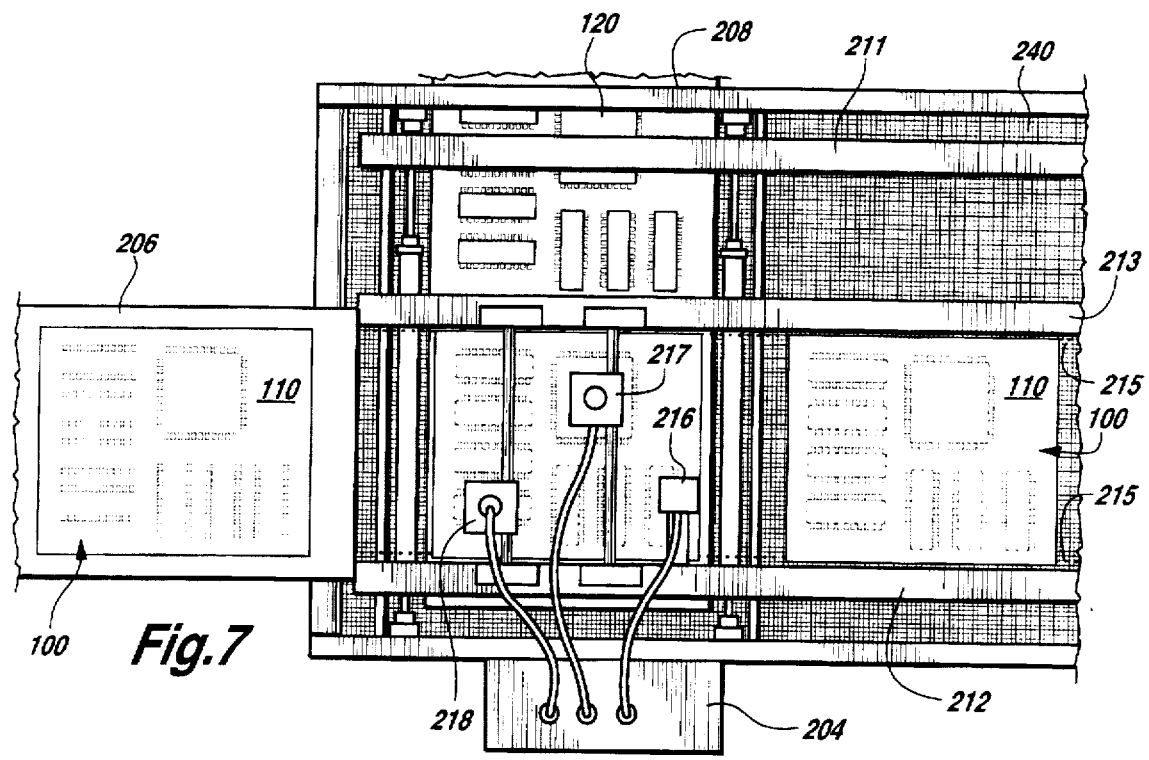
FIGS. 7 and 8 are top level and perspective views of the de-population area, showing photo sensor 216 and vibrating plunging devices 217 and 218 shown in FIG. 3.

Referring to FIGS. 3 and 7, when the heated PWA 100 reaches the photo sensor 216, an electronic signal with a preset delay time is sent to vibrating plunging devices 217 and/or 218. This delay time permits the necessary time for PWA 100 to reach the appropriate position beneath the vibrating plunging devices 217 and 218, before the vibrating plunging devices 217 and/or 218 are activated. In the example shown, the delay time may be varied from 0 to 6 seconds and is nominally set at 2 seconds. For a typical run, as shown in FIGS. 6A, 6B, and 6C, vibrating plunging devices 217 and/or 218 are preferably comprised of plunger 219 held within solenoid 221. Plunger 219 is preferably comprised of metal. When solenoid 221 is activated, plunger 219 oscillates in a vertical direction 223. Vibrating plunging devices 217 and/or 218 are positioned such that one end 219A (i.e., the bottom end) of plunger 219 strikes the one side 110A (i.e., the back side) of PWB 110 of PWA 100 as PWB 110 travels beneath plunger 219. The force of the striking plunger 219 applied the side 110A of PWB 110 overcomes the surface tension of the solder holding the electrical components 120 to PWB 110 in the immediate area of PWB 110 that is subjected to the vibration. Electrical components 120 fall, under force of gravity, onto the transverse component conveyor 208, which transports electrical components 120 to sorting and packaging station 209. Vibrating plunging devices 217 and/or 218 are connected to de-population circuit control module 204 that allows adjustment of both the dwell time (the time during which solenoid 221, and, thus the vibrating plunging device 217 and/or 218 is activated) and the voltage applied to solenoid 221, and, consequently, the vibrating intensity (the force with which plunger 219 strikes side 110A of PWB 110). In the example shown, the dwell time is variable from 0.5 to 6 seconds. And, the intensity is variable from 0–100% of full intensity. Once again, adjustments may be made to these settings to permit a greater or lesser amount of vibrating force and vibrating time to be applied to side 110A of PWB 110, which permits selected areas of PWB 110 to be affected and, thereby, only selected electrical components 120 will be removed.

As shown in FIGS. 2, 3, 5, 7, and 8, removed electrical components 120 travel via conveyor 208 out of heating unit(s) 201A and 201B, past sorting and packaging station 209, where they may be manually sorted and packaged. Because the removed components fall onto transverse component conveyor 208 in the precise arrangement that they were placed on PWA 100 originally, sorting and separation procedures are simplified. Metal leads of electrical components 120 removed from PWA's 100 using the preferred techniques are remarkably free from residual solder than is the case when components are manually removed by conventional techniques and, thus, generally require no further clean-up prior to packaging. The de-populated or partially de-populated PWA's 100 exit heating unit(s) 201A and 201B via de-population conveyor 206 to de-populated board collection container 207. These de-populated PWB's 110 may then be sent to a facility where precious and semi-precious metals may be recovered and the non-metallic base material, fiberglass and epoxy binding resin, may be recycled.

Figure 10:
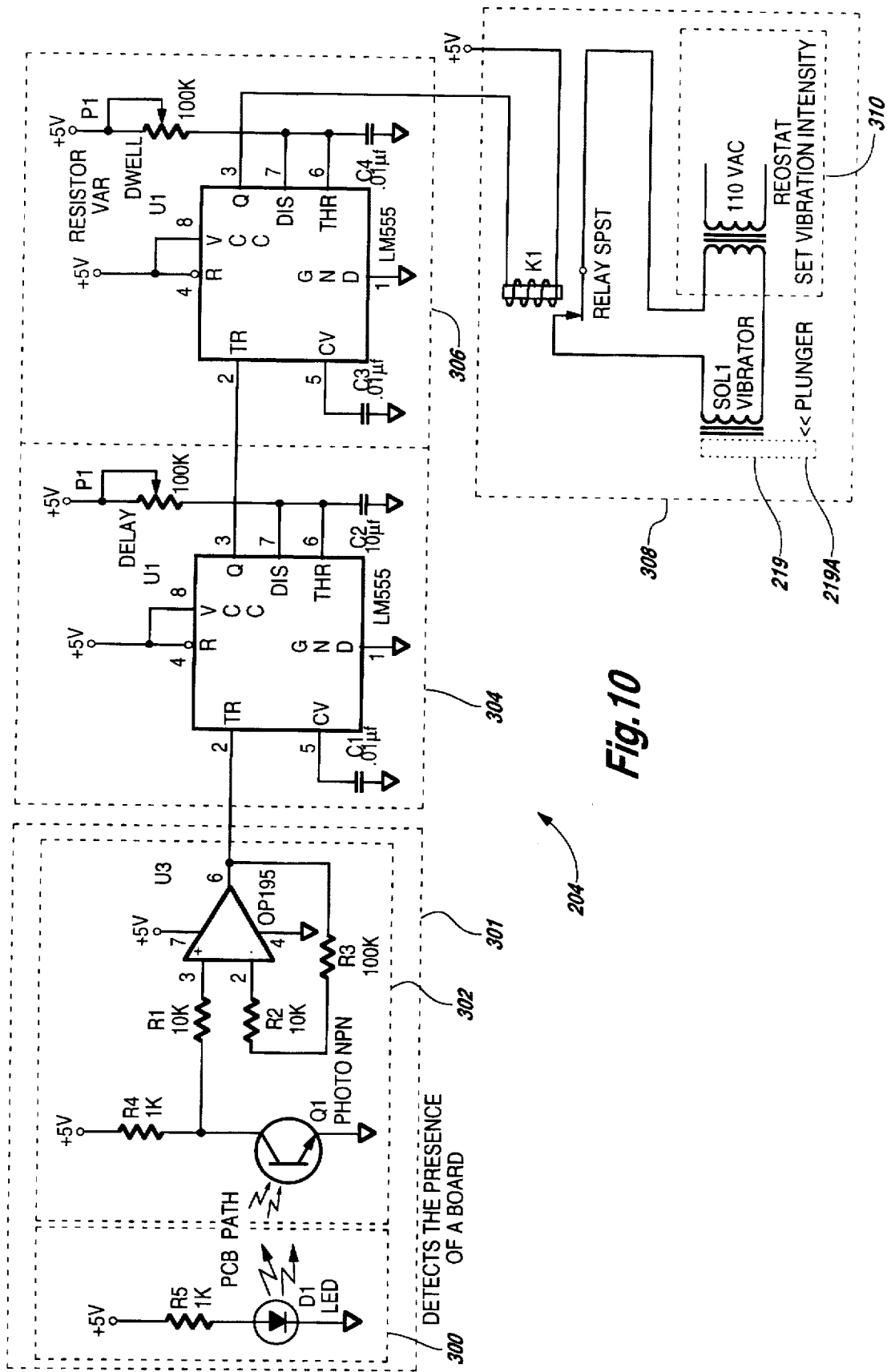
FIG. 10 is a circuit diagram of de-population circuit control module 204.

FIG. 10 is a circuit diagram of de-population circuit control module 204. Referring to FIG. 10, de-population circuit control module 204 is generally comprised of a light source 300 (e.g., as a light emitting diode ("LED") circuitry shown in FIG. 10), light receiving circuitry 302 (e.g., the photo NPN transistor and operational amplifier circuit shown in FIG. 10), delay circuitry 304 to control the starting point of the vibration (e.g., the timer and variable resistor circuit shown in FIG. 10), the dwell circuitry 306 to control the dwell time (the time period in which the vibration occurs) (e.g., the timer and variable resistor circuit shown in FIG. 10), and the plunger control circuitry 308 to control plunger 223. Light source 300 and light receiving circuitry 302 are combined to form presence detector 301 that detects the presence of a PWA 100. Plunger control circuitry 308 comprises a rheostat 310 to set the vibration intensity. Central portions of the circuitry, such as delay circuitry 304 and dwell circuitry 306, and plunger control circuitry 308, can be duplicated to control additional plungers.

FURTHER MODIFICATIONS AND VARIATIONS

Although the invention has been described with reference to a specific embodiment, this description is not meant to be construed in a limiting sense. The example embodiments shown and described above are only intended as an example. For instance, the preferred embodiments could be used to detach electrical components attached with other techniques, such as the "through hole" technique.

Various modifications of the disclosed embodiment as well as alternate embodiments of the invention will become apparent to persons skilled in the art upon reference to the description of the invention. The following figures and the accompanying description are used to describe the principles of the present invention. Other configurations of heating elements, transport chains, conveyors, photo sensors and PWA vibration devices may be used to automatically and selectively remove components from PWA's according to the present invention. Other electrical components besides IC's can be removed as well, such as capacitors, resistors, etc. Additional independent positioning, delay time, dwell time, and intensity settings may be used to affect a wide range of component removal options for each vibrating plunger. Thus, even though numerous characteristics and advantages of the present inventions have been set forth in the foregoing description, together with details of the structure and function of the inventions, the disclosure is illustrative only, and changes may be made in the detail, especially in matters of shape, size and arrangement of the parts within the principles of the inventions to the full extent indicated by the broad general meaning of the terms used in the attached claims.

Accordingly, it should be understood that the modifications and variations suggested above and below are not intended to be exhaustive. These examples help show the scope of the inventive concepts, which are covered in the appended claims. The appended claims are intended to cover these modifications and alternate embodiments. In short, the restrictive description and drawings of the specific examples above are not intended to point out what an infringement of this patent would be, but are to provide at least one explanation of how to make and use the inventions contained herein. The limits of the inventions and the bounds of the patent protection are measured by and defined in the following claims.

What is claimed:

1. An apparatus for removing at least one selected electrical component from a printed wiring board of a printed wiring assembly, said at least one selected electrical component surface mounted to said printed wiring board with solder, said solder having a flow temperature, comprising:

(a) an oven having an enclosed heated chamber having a printed wiring assembly entrance port, a printed wiring assembly exit port, and an electrical component exit port, said enclosed heated chamber heats said printed wiring assembly until said solder reaches said flow temperature;

(b) a transport mechanism extending along a transport path from said printed wiring assembly entrance port to said printed wiring assembly exit port inside said enclosed heated chamber, said transport mechanism transports said printed wiring assembly along said transport path from said printed wiring assembly entrance port to said printed wiring assembly exit port, (c) a presence detector proximately positioned to said transport path to determine when said printed wiring assembly arrives at a first location and said printed wiring assembly is positioned at said first position, said oven causing said solder to reach said flow temperature at said first position;

(d) a mechanical vibrator positioned to vibrate a selected portion of said printed wiring board of said printed wiring assembly with a first vibrating intensity for a first time period, said first vibrating intensity of sufficient intensity and said first time period of sufficient duration to detach said at least one selected electrical component from said printed wiring board, so that said at least one selected electrical component can fall on a first transporting conveyor extending from said first location inside said enclosed heated chamber through said electrical component exit port to a location exterior to said enclosed chamber, said presence detector electrically coupled to said mechanical vibrator to activate said mechanical vibrator when said printed wiring assembly is positioned at said first location; and (e) a second transporting conveyor ending from said printed wiring assembly exit port to remove said printed wiring assembly from said heated chamber.

2. The apparatus of claim 1, wherein said enclosed heated chamber is divided into a plurality of heated zones, each zone of said plurality of heated zones independently controlled to gradually heat said solder of said printed wiring assembly to said flow temperature.

3. The apparatus of claim 2, wherein each heated zone of said plurality of heated zones has a temperature in a range of 0°–999° F.

4. The apparatus of claim 1, wherein said enclosed heated chamber has a base, a lid, and a hinge mechanically coupled to said base and to said lid, so that said enclosed heated chamber can be selectively opened to allow access to said enclosed heated chamber.

5. The apparatus of claim 4, wherein a plurality of heaters are positioned in said lid and said base to heat said printed wiring assembly.

6. The apparatus of claim 1, wherein said oven comprises at least one heater in said enclosed heated chamber and further comprising a screen positioned under said transport mechanism, said presence detector, and said mechanical vibrator to catch said at least one electrical component that prematurely falls from said printed wiring board of said printed wiring assembly.

7. The apparatus of claim 6, wherein said screen is comprised of thermally conductive material.

8. The apparatus of claim 6, wherein said screen is movable and forms a conveyor belt to transport said at least one electrical component that prematurely falls from said printed wiring board of said printed wiring assembly.

9. The apparatus of claim 1, wherein said first time period is between 0.5 to 6 seconds.

10. The apparatus of claim 1, wherein said transport mechanism is further comprised of:

(b1) a first rail and a second rail positioned on opposite sides of said printed wiring assembly along said transport path; and (b2) at least one transporting chain selectively attached to said printed wiring assembly to transport said printed wiring assembly along said transport path.

11. The apparatus of claim 10, wherein a first distance separates said first rail from said second rail, said first distance is adjustable by moving said second rail.

12. The apparatus of claim 1, wherein said transport mechanism transports said printed wiring assembly at a first speed and further wherein said transport mechanism further comprises control circuitry electrically coupled to a motor that powers and moves at least one transport chain, said at least one transport chain is selectively attached to said printed wiring assembly, said control circuitry controls said first speed.

13. The apparatus of claim 12, wherein said first speed is between 0.05–12.00 feet per minute.

14. The apparatus of claim 1, wherein said mechanical vibrator comprises an oscillating plunger that when said mechanical vibrator is activated by said presence detector, said oscillating plunger contacts said printed wiring assembly with a first force to generate said first vibrating intensity, thereby vibrating said printed wiring assembly.

15. The apparatus of claim 1, wherein said transport mechanism is adapted to accommodate said printed wiring assembly when said printed wiring assembly has a width between ¼" to 18½" inches.

16. The apparatus of claim 1, further comprising electrical delay circuitry electrically coupled to said presence detector and to said mechanical vibrator, said electrical delay circuitry causes said presence detector to delay activating said mechanical vibrator.

17. The apparatus of claim 1, wherein said mechanical vibrator further having control circuitry electrically coupled to said mechanical vibrator, said control circuitry to independently control said first intensity and said first time period.

18. The apparatus of claim 17, further wherein said presence detector comprises a light source and a photo sensor, said light source emits light that extends across said transport path, said photo sensor activates said mechanical vibrator when said light source is shielded by said printed wiring assembly and said control circuitry further comprises a rheostat electrically coupled to said mechanical vibrator, delay circuitry, and dwell circuitry, said control circuitry to control said first intensity, said delay circuitry to control said first time, and to said dwell circuitry to independently control said first time period.

19. The apparatus of claim 1, wherein said printed wiring assembly has a first surface and a second surface, said at least one selected electrical component is positioned on said first surface, said selected portion of said printed wiring board is on said second surface, said fit surface is positioned downward, so that said at least one selected electrical component falls under a force of gravity after said printed wiring assembly has been vibrated by said mechanical vibrator at said selected portion.

20. The apparatus of claim 1, wherein said presence detector comprises a light source and a photo sensor, said light source emits light that extends across said transport path, said photo sensor activates said mechanical vibrator when said light source is shielded by said printed wiring assembly.

21. The apparatus of claim 1, wherein said mechanical vibrator starts vibrating said printed wiring assembly at a first time for said first time period, said mechanical vibrator is further comprised of control circuitry, said control circuitry controls said first time and said first time period.

22. An apparatus for removing at least one selected electrical component from a printed wiring board of a printed wiring assembly, said at least one selected electrical component surface mounted to said printed wiring board with solder, said solder having a flow temperature, comprising:

(a) at least one heater to heat said printed wiring assembly until said solder reaches said flow temperature, comprising:

(b) a presence detector to determine when said printed wiring assembly is properly positioned at a first location after said solder of said printed wiring assembly has been heated by said at least one heater to said flow temperature;

(c) a vibrator positioned to vibrate a selected portion of said printed wiring board of said printed wing assembly with a first intensity for a first time period, said first intensity of sufficient strength and said first time period of sufficient duration to detach said at least one selected electrical component from said printed wiring assembly, said presence detector electrically coupled to said mechanical vibrator to activate said mechanical vibrator when said printed wiring assembly is positioned at said first location; and (d) a screen positioned to catch said at least one electrical component that prematurely falls from said printed wiring board of said printed wiring assembly.

23. The apparatus of claim 22, further comprising:

(e) a transport mechanism to automatically transport said printed wiring assembly past said at least one heater to said first location.

24. The apparatus of claim 23, wherein said transport mechanism is further comprising:

(d1) a first rail and a second rail positioned on opposite sides of said printed wiring assembly; and (d2) at least one transporting chain selectively attached to said printed wiring assembly to transport said printed wiring assembly to said first location.

25. The apparatus of claim 23, wherein said transport mechanism transports said printed wiring assembly at a first speed, said first speed between 0.05–12.00 feet per minute.

26. The apparatus of claim 23, wherein said transport mechanism transports said printed wiring assembly at a first speed and further wherein said transport mechanism further comprises control circuitry electrically coupled to a motor that powers and moves at least one transport chain, said transport chain is selectively attached to said printed wiring assembly and transports said printed wiring assembly to said first location.

27. The apparatus of claim 22, wherein said printed wiring assembly has a first surface and a second surface, said at least one selected electrical component is positioned on said first surface, said selected portion is on said second surface, said first surface is positioned downward, so that said at least one selected electrical component falls under a force of gravity after said printed wiring assembly has been vibrated by said mechanical vibrator at said selected portion.

28. The apparatus of claim 22, wherein said presence detector comprises a light source and a photo sensor, said light source emits light that extends across said transport path, said photo sensor activates said mechanical vibrator when said light source is shielded by said printed wiring assembly.

29. The apparatus of claim 22, wherein said mechanical vibrator starts vibrating said printed wiring assembly at said first time for a first time period, said mechanical vibrator is further comprised of control circuitry, said control circuitry controls said first time and said first time period.

30. The apparatus of claim 22, wherein said mechanical vibrator comprises an oscillating plunger that when said mechanical vibrator is activated by said presence detector, said oscillating plunger contacts said printed wiring assembly with a first, force to generate said first intensity, thereby vibrating said printed wiring assembly.

31. The apparatus of claim 22, wherein said at least one heater heats said solder to a temperature in a range of 0°–999° F.

32. The apparatus of claim 19, wherein said first time period is between 0.5 to 6 seconds.

33. A process for removing at least one selected electrical component from a printed wiring board of a printed wiring assembly, said at least one selected electrical component surface mounted to said printed wiring board with solder, said solder having a flow temperature, comprising the following steps:

(a) heating said printed wiring assembly until said solder reaches said flow temperature;

(b) automatically transferring and positioning said printed wiring assembly to a first position;

(c) automatically vibrating a selected portion of said printed wiring board of said printed wiring assembly with a first intensity for a first time period, said first intensity of sufficient strength and said first time period of sufficient duration to detach said at least one selected electrical component from said printed wiring board;

(d) transporting by a first conveyor belt of said at least one selected electrical component away from said first position; and (e) transporting by a second conveyor belt of said printed circuit board of said electrical wiring assembly away from said first position.

34. The process of claim 33, further comprising after (a) and (b):

(d) automatically detecting when said printed wiring assembly is positioned at said first position and automatically initiating a vibrator to perform (c).

35. The process of claim 33, wherein said first time period is between 0.5 to 6 seconds.

36. The process of claim 22, wherein said (a) heats said printed wiring assembly in a gradual, controlled fashion until to a temperature between 0°–999° F.

37. The process of claim 33, wherein (b) is performed at a rate between 0.05–12.00 feet per minute.

38. The apparatus of claim 22, further comprising:

(e) a first transporting conveyor extending from said first location to a second location to catch and transport said at least one selected electrical component away from said first location; and (f) a second transporting conveyor extending from said first location to a third location to catch and transport said printed wiring board and any remaining electrical components attached thereto, if any, of said printed wiring assembly away from said first location.

39. The apparatus of claim 22, wherein said at least one heater is positioned in an enclosed chamber, said at least one heater divided into a plurality of heated zones, each heated zone of said plurality of heated zones independently controlled to gradually heat said solder of said printed wiring assembly to said flow temperature.

40. The apparatus of claim 39, wherein said enclosed chamber has a base, a lid, and a hinge mechanically coupled to said base and to said lid, so that said enclosed chamber can be selectively opened to allow access to said enclosed chamber.

41. The apparatus of claim 22, wherein said screen is positioned over said at least one heater.

* * * * *